(12) United States Patent
Wiezell et al.

(10) Patent No.: US 10,951,197 B2
(45) Date of Patent: Mar. 16, 2021

(54) ON-CHIP BALUN

(71) Applicant: Sequans Communications S.A., Colombes (FR)

(72) Inventors: Martin Wiezell, Colombes (FR); Jonas Jonsson, Colombes (FR); Peter Olofsson, Colombes (FR)

(73) Assignee: SEQUANS COMMUNICATIONS S.A., Colombes (FR)

( * ) Notice: Subject to any disclaimer, the term of this patent is extended or adjusted under 35 U.S.C. 154(b) by 0 days.

(21) Appl. No.: 16/455,651

(22) Filed: Jun. 27, 2019

(65) Prior Publication Data
US 2020/0412340 A1 Dec. 31, 2020

(51) Int. Cl.
*H03H 11/32* (2006.01)
*H03H 11/04* (2006.01)
*H01F 17/00* (2006.01)
*H04B 1/16* (2006.01)

(52) U.S. Cl.
CPC ......... *H03H 11/32* (2013.01); *H01F 17/0006* (2013.01); *H03H 11/04* (2013.01); *H03H 2011/0488* (2013.01); *H04B 1/16* (2013.01)

(58) Field of Classification Search
None
See application file for complete search history.

(56) References Cited

U.S. PATENT DOCUMENTS

| | | | |
|---|---|---|---|
| 4,577,168 A | 3/1986 | Hartmann | |
| 4,694,266 A | 9/1987 | Wright | |
| 7,327,131 B2 | 2/2008 | Ezzeddine | |
| 7,683,733 B2 | 3/2010 | Li et al. | |
| 7,961,063 B2 | 6/2011 | Liu et al. | |
| 8,208,887 B2 | 6/2012 | Lee et al. | |
| 9,166,731 B2 | 10/2015 | Chang et al. | |
| 10,483,937 B2 * | 11/2019 | Chen et al. | H03H 7/0115 |
| 2015/0288392 A1 * | 10/2015 | Floyd et al. | H04B 1/0475 375/130 |
| 2019/0165751 A1 * | 5/2019 | Chen | H03H 7/0115 |

* cited by examiner

*Primary Examiner* — Cassandra F Cox
(74) *Attorney, Agent, or Firm* — Hamilton, Brook, Smith & Reynolds, P.C.

(57) ABSTRACT

An on-chip balun comprising a primary side, a secondary side, and an integrated notch filter.

19 Claims, 6 Drawing Sheets

ON-CHIP BALUN

TECHNICAL FIELD

This disclosure relates to a balun (a balanced to unbalanced signal converter) comprising a tunable filter. It is particularly suited, but by no means limited, to a balun to block $3^{rd}$ order harmonics that will be mixed by a local oscillator (LO).

BACKGROUND

Baluns are frequently used in radio transceivers to convert single-ended (unbalanced) signals to differential (balanced) signals, or vice versa. Parameters important for balun performance include balance, insertion loss (S21) and filtering.

In any circuit, the wanted signals depend on balun loss, which should be as low as possible. Unwanted signals are desired to be attenuated as much as possible. This can be achieved by, for example, filtering, or common-mode rejection of a balanced signal as would be understood.

Specific unwanted signals for a receiver chain are the signals close to odd-order harmonics (3rd, 5th, 7th etc) of the LO, since they will fall directly into the wanted band after mixing as would be understood. The 3rd harmonic is closest to the wanted signal and therefore has the lowest natural filtering by matching network tuning or low noise amplifier LNA) tuning, and usually requires some extra filtering as would be understood.

External baluns are often used to achieve good performance, and typically comprise large and expensive transformers. On-chip baluns may also be used, however, in both cases, external SAW-filters or similar are required to attenuate unwanted blockers, such as odd-order LO harmonics as mentioned previously. Such external filter components are usually large and expensive which increase PCB real-estate requirements and manufacturing cost.

On-chip filters in combination with on-chip baluns may also used, however good performance, such as better blocker attenuation and insertion loss, is difficult to attain. Further, such on-chip balun/filter combination would occupy a huge chip area in order to obtain close to the expected filter performance of external components. This increases cost.

Other attempts to filter unwanted signals both on-chip and off-chip use a combination of baluns and filters. These include an additional transformer being inserted between the LNA and the mixer. This solution requires an extra on-chip transformer which occupies a large area. The transformer will decrease the high impedance at the LNA output and thus degrade the LNA gain noise figure. Also, blockers at the LNA inputs are not filtered, and will instead be amplified.

Alternatively, a balun may be used before the LNA. In a first system, the balun center-tap may be connected through a [low-ohmic] LC path at the notch frequency. Hence, the unwanted signals see a different inductor at the primary side and are thus attenuated. This solution relies on a low-ohmic path which is difficult to achieve, and the attenuation is limited to 10-20 dB attenuation. In a second system, the balun primary and secondary center-taps may be shorted, thus generating a filtering-effect.

Other methods use a quadrature coupler in combination with SAW filters to achieve heavy filtering. This increases PCB real-estate requirements.

Accordingly there is a need for a balun to overcome these challenges.

SUMMARY

According to an aspect there is provided an on-chip balun as defined in claim 1. The on-chip balun comprising:
a primary side;
a secondary side; and
a notch filter.

Optionally, the on-chip balun wherein the notch filter is tunable.

Optionally, the on-chip balun wherein the notch filter is tunable so as to reject unwanted signals between 1.8 Ghz and 3 Ghz.

Optionally, the on-chip balun wherein the notch filter is tunable so as to reject one or more unwanted harmonics.

Optionally, the on-chip balun wherein the notch filter is tunable so as to pass wanted signals between 800 Mhz and 1 Ghz.

Optionally, the on-chip balun wherein the notch filter comprises a capacitance in parallel with a portion of the primary side.

Optionally, the on-chip balun wherein the notch filter comprises a capacitance in parallel with a portion of the secondary side.

Optionally, the on-chip balun wherein the notch filter comprises a capacitance in parallel with a portion of the primary side and a capacitance in parallel with a portion of the secondary side.

Optionally, the on-chip balun wherein the capacitances are arranged to be independently tunable.

Optionally, the on-chip balun wherein the notch filter comprises switches arranged to add or subtract capacitance from the notch filter.

Optionally, the on-chip balun wherein the switches are arranged so that the capacitance of the notch filter may be added to or subtracted from on the fly.

Optionally, the on-chip balun wherein the layout of the balun is symmetrical between primary side and secondary side.

Optionally, the on-chip balun wherein the primary and secondary side comprise inductors formed by concentric tracks of the balun.

Optionally, the on-chip balun wherein the primary and secondary sides are formed of a single layer of metal.

Optionally, the on-chip balun wherein the primary and secondary sides are formed of a plurality of layers of metal.

Optionally, the on-chip balun wherein the primary side is formed on one layer of metal of the chip and the secondary side is formed on another layer of metal of the chip.

According to a second aspect there is provided a receive chain comprising the balun defined in claim 1.

BRIEF DESCRIPTION OF THE DRAWINGS

Embodiments will now be described, by way of example only, and with reference to the drawings in which.

OVERVIEW

Figure 1A:
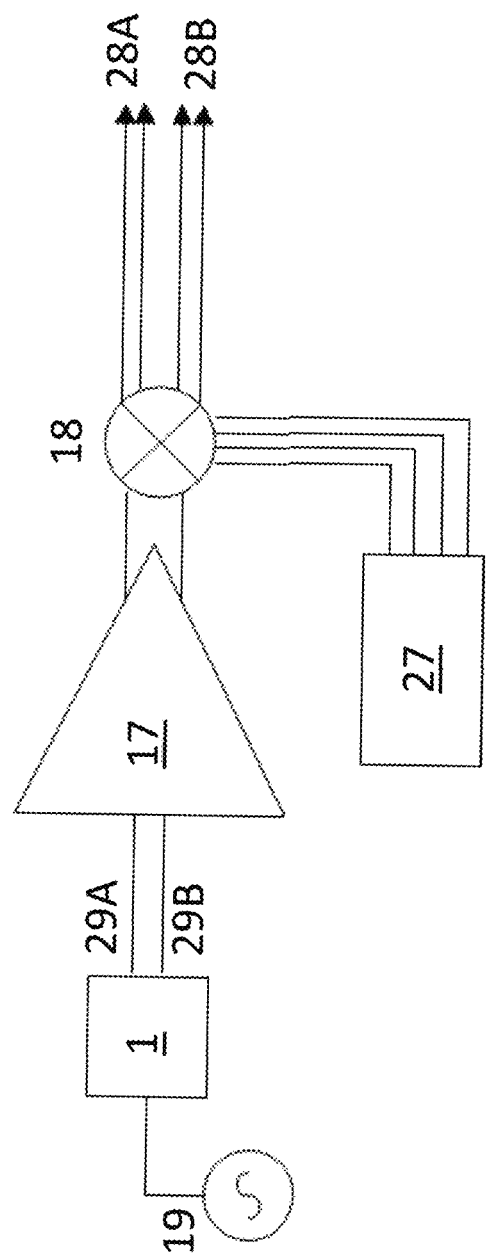
FIG. 1A illustrates a typical receive chain including a balun.

A new type of on-chip balun with integrated notch filtering is disclosed for filtering out the unwanted 3rd order LO harmonic blocker, but may also be used for the filtering of any type of blocker. FIG. 1A shows a typical receiver chain with a balun 1 according to this disclosure. An input signal 19 is fed into balun 1, with a balanced differential signal 29A, 29B being output from the balun. Typical components of a receive chain (LNA 17, mixer 18 and local oscillator 27) are then arranged to extract in-phase and quadrature baseband differential signals 28A, 28B as would be understood.

DETAILED DESCRIPTION

Figure 1B:
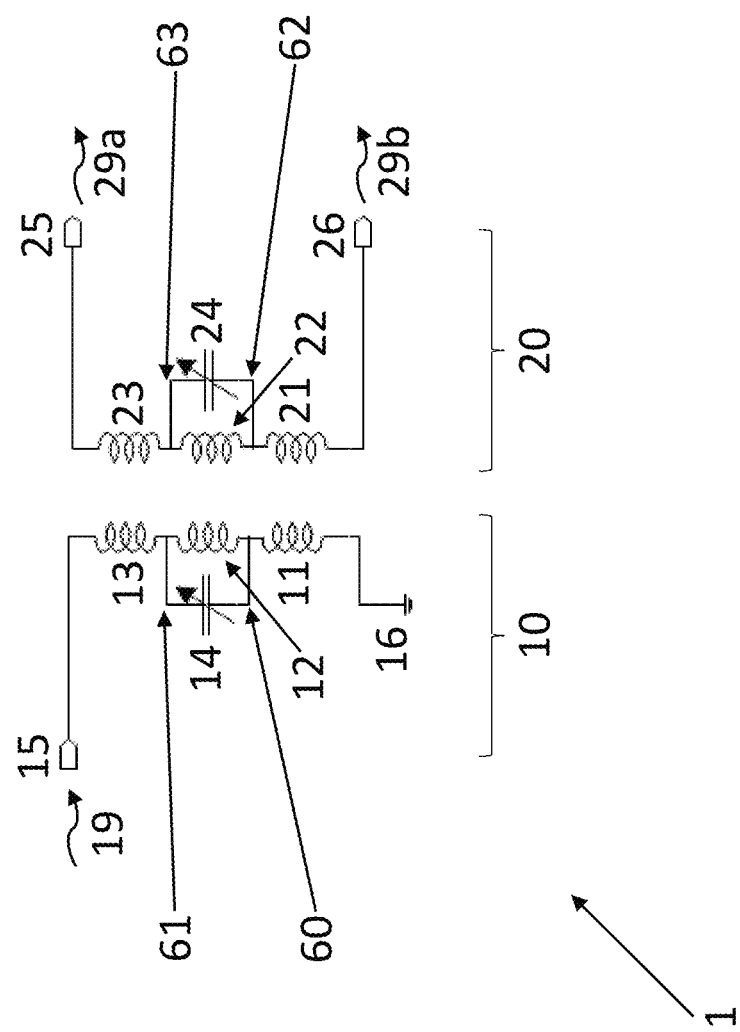
FIG. 1B illustrates a simplified model of a balun with notch capacitors.

Turning to FIG. 1B, a model of a balun 1 with notch capacitors is illustrated. The model comprises a primary side of the balun 10 and a secondary side of the balun 20. The primary side comprises three inductors (11, 12, 13) in series. These inductors can be considered to be a primary inductor of the balun. The secondary side comprises three inductors (21, 22, 23) in series. These inductors can be considered to be a secondary inductor of the balun. A notch function comprising two trimmable capacitances (illustrated as notch capacitors 14, 24) are positioned across a portion of each of the primary and secondary sides of the balun. The trimmable capacitances may be positioned respectively across a primary side inductor and a secondary side (known as notch inductors 12, 22).

When the balun 1 is in use, a single-end input signal 19 enters node 15 with node 16 grounded, whereby the magnetic coupling between the primary and secondary sides will provide a balanced output in the form of differential output signals 29A, 29B at nodes 25 and 26 with unwanted signal filtered out according to notch filter 14, 24 settings. Differential output signals 29A, 29B have a 180 degrees phase shift difference.

For a wanted (lower) frequency of, say 750 MHz in the example below, input signal 19, capacitors 14 and 24 can be approximated to an open circuit (i.e. not part of the circuit), resulting in standard balun functionality. At the unwanted (higher) frequencies, say 2.25 GHz in the example below, primary side capacitance 14 and secondary side capacitance 24 short the inductors that they are across (12 and 22 respectively). It is this 'LCL' arrangement that provides the notch characteristic as this causes the capacitance to resonate with their respective primary side inductors 11,13 and secondary side inductors 21, 23 forming a short-circuited path with low impedance. The short-circuiting by capacitances 14 and 24 occurs at approximately the resonance frequency:

There are two notch frequencies, one for the primary side, and one for the secondary side. Both notch frequencies can be independently tuned to FREQnotch,prim and FREQnotch,sec according to:

$$FREQnotch, prim = \frac{1}{2\pi\sqrt{((Lres, prim)(Cres, prim))}}$$

$$FREQnotch, sec = \frac{1}{2\pi\sqrt{((Lres, sec)(Cres, sec))}}$$

Where $L_{res,prim}$ = sum of inductors 11 and 13 and $L_{res,sec}$ = sum of inductors 21 and 23

$C_{res,prim}$ = capacitance 14

$C_{res,sec}$ = capacitance 24

When the capacitances are tuned to different values on each of the primary and secondary sides, the notch frequency is calculated separately for the components of each side.

Figure 2:
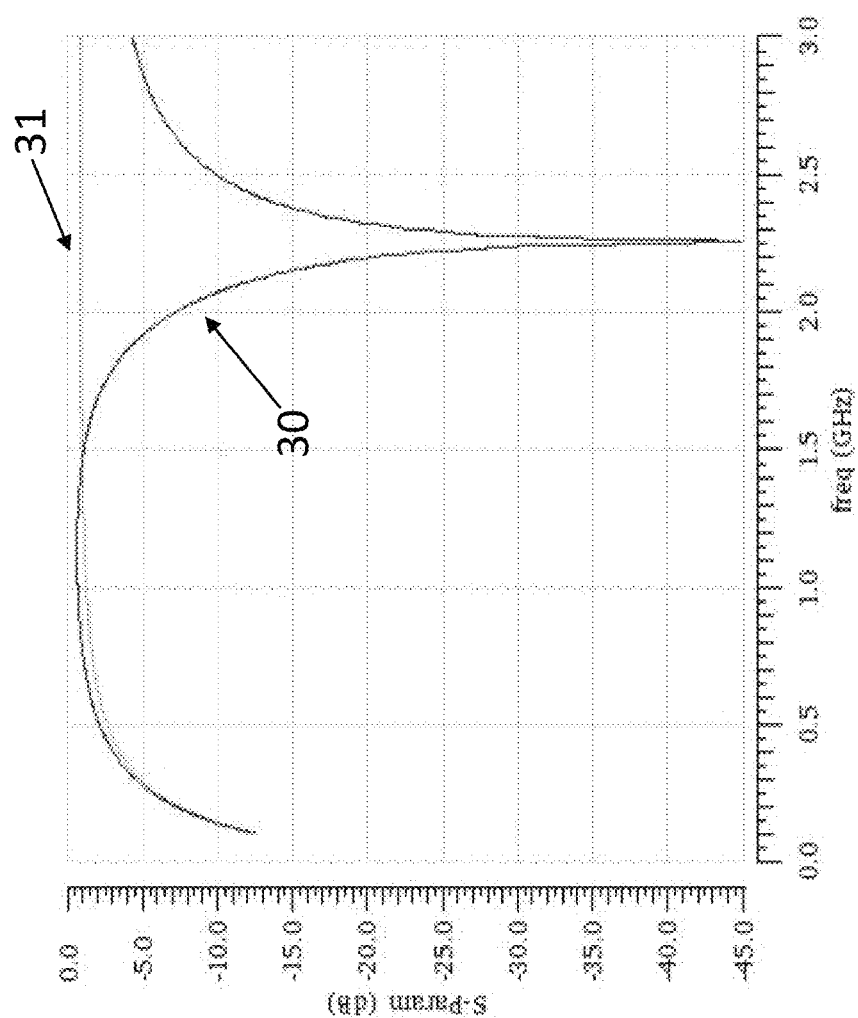
FIG. 2 illustrates insertion loss for a standard balun and for a balun according to the disclosure with integrated notch filter.

From FIG. 2, it can be seen that the resulting signal 30 is heavily attenuated at the notch frequency compared to an unfiltered signal 31. The wanted signal is in this example, 750 MHz, and the unwanted blocker frequency is the 3rd harmonic at 2.25 GHz. The blocker signal is being attenuated by more than 40 dB.

The structure of the balun and notch capacitors is preferably symmetrical with respect to the primary/secondary interface. This means that the two notch capacitances 14, 24 operate simultaneously, thus attenuating at the primary and at the secondary side at the same frequency. This provides efficient blocking of unwanted signals. The preferred balun comprises the same impedance on the primary and secondary sides so as to enhance the symmetric effect.

By choosing the values for inductors 11,13, 21,31, notch capacitances 14,24 and notch inductors 12, 22 to suit performance required, both excellent transmission for the wanted signal, and attenuation for the unwanted blocker signals can be obtained. Trimmable capacitors may be used to obtain attenuation over a wide frequency range.

Typical values for an LTE low band 1:1 balun:
Inductors 11, 13, 21, 23=1 nH
Inductors 12, 22=20 nH
Notch capacitors 14, 24=0.3-4 pF
Typical values for an LTE mid band 1:1 balun:
Inductors 11, 13, 21, 23=0.5 nH
Inductors 12, 22=3.5 nH
Notch capacitors 14, 24=0.3-1.7 pF The three inductor balun model shown in FIG. 1B is simplified for ease of explaining the essence of this disclosure.

Figure 3:
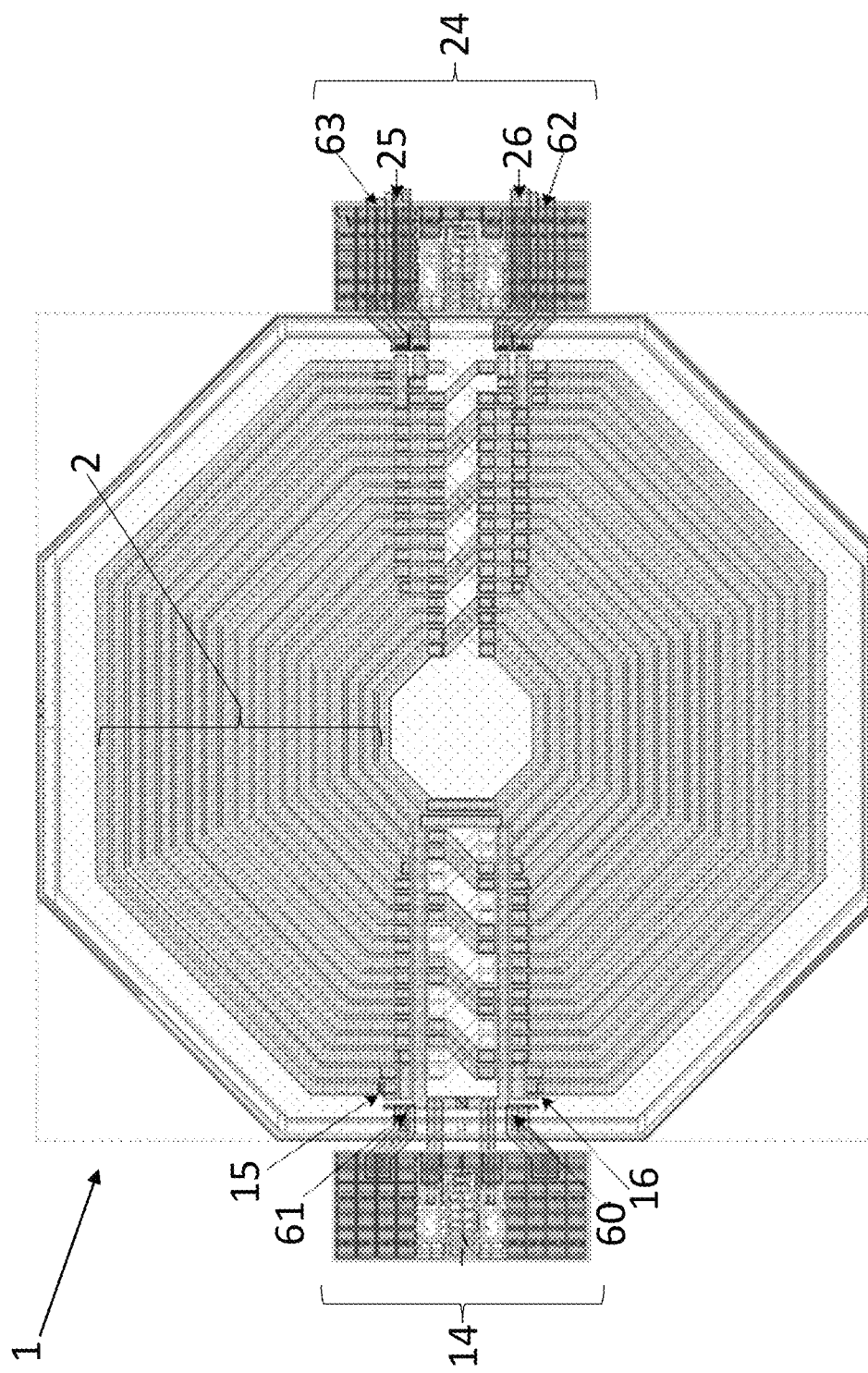
FIG. 3 illustrates on-chip layout example of the disclosed balun with integrated notch filters.

Turning to FIG. 3, a 3D electro-magnetic simulation where all of the electro-magnetic couplings are taken into account for the whole of the structure of the balun of this disclosure is now discussed.

FIG. 3 shows an on-chip layout example of the new type of balun with integrated notch filter according to this disclosure. Like reference numerals denote features from the circuit of the model of FIG. 1B. At the heart of the balun are concentric tracks 2 (here shown in an octagon geometry). These tracks form the inductors of the balun according to FIG. 1B. Note that the tracks of FIG. 3 show an example layout, and are not intended to illustrate any limitation in terms of track shape or layer(s) used. In this example, the left hand side of the balun comprises notch capacitance 14 for the primary side (by way of nodes 60, 61 of FIG. 1B) and the right hand side comprises notch capacitance 24 for the secondary side (by way of nodes 62, 63 of FIG. 1B). Both of these capacitances are tunable as explained in relation to FIG. 4.

The balun comprises i/p and o/p ports for the primary and secondary sides as shown by the nodes 15,16 for input single-ended signal 19 on the primary side and nodes 25, 25 for output differential signal 29A, 29B on the secondary side.

The primary inductor 11 (of FIG. 1B) is indicated by a thick dashed line in FIG. 3, while the inductor segment 13 (of FIG. 1B) is indicated by a dotted line in FIG. 3. In this example, the inductor segments 11 and 13 use the $1^{st}$ and $3^{rd}$ windings (concentric tracks). Moreover, inductors 11 and 13 are preferably as symmetrical as possible. Throughout this specification, as symmetrical as possible can be considered to mean as symmetrical as the geometry in use allows. Inductor 12 (of FIG. 1B) is indicated with a thin dashed line and uses windings 5, 7, 9, 11, 13, 15, 17, 19 (winding 19 being the centre-most winding as can be seen). In this example, the primary side inductors are comprised of 10 turns in total (1+8+1).

Turning to the secondary side, inductors 21 and 23 (in FIG. 1B) are formed in a similar way (not indicated in the figure). In this example the $2^{nd}$ and $4^{th}$ windings are inductors 21 and 23 respectively. As with the primary side, inductors 21 and 23 are preferably as symmetrical as possible. Inductor 22 is the remaining 7 even windings (6, 8, 10, 12, 14, 16, 18). In this example, the secondary side inductors are comprised of 9 turns in total (1+7+1).

It is desired that the primary and secondary inductors have as high magnetic coupling as possible, and are usually located nearby, for example interdigitized as in this single layer example, or on top of each other (in a multi-layer example). Note that FIG. 3 is an example layout. Many other layouts including single layer and multilayer are suitable for the primary side inductors 11,12,13, and secondary side inductors 21, 22, 23.

The small additional area that is required for the notch filters 14, 24 can be seen. In general, the higher the frequency of the unwanted signal, the smaller the notch capacitors need to be, that is to say that the additional area required is approximately inversely proportional with the frequency of the unwanted signal. The desired notch-filtering will add only a small percentage increase of the total notch-balun area, and this percentage would be even lower for higher frequencies. The notch filters may be positioned anywhere appropriate on the balun and are not limited to where shown in FIG. 3. Preferably, the notch filters will be positioned in a symmetrical arrangement to ensure symmetrical coupling and balancing. However, for on-chip real-estate reasons, the notch filters may be positioned elsewhere around the periphery of the balun. As would be understood, this would not be preferable as non-symmetries, resulting in degraded filtering performance may be present. The notch filters may be present on the primary side, secondary side or both sides as shown in the example of FIG. 3. The notch filters can be trimmed (see FIG. 4) independently and on the fly to provide flexibility of filtering function.

Even though this invention is not relying on symmetry, a symmetrical structure is preferable to achieve good phase and amplitude balance between the output signals.

The balun is designed with the aim of minimising on-chip (resistive) losses. This is achieved by minimising track length from the input nodes 15,16 to notch capacitor 14, and from notch capacitor 24 to output nodes 25,26. Further, it is preferable to incorporate track layouts without 90 degree turns to reduce reflections. The balun is shown as an octagon shape in FIG. 3, however, any shape for example and not limited to a circle, hexagon, decagon could be used with the aim of avoiding 90 degree track angles.

In FIG. 3, the balun is arranged on a single metal layer which provides good magnetic coupling in the x-y plane as would be understood. Additionally or alternatively, a metal layer may be stacked to provide the primary and secondary sides spaced in the z-axis which would result in magnetic coupling in the z-plane. It is noted that the small central area of crossover layers do not contribute to the coupling, nor the filter and are kept as small as possible, just enough to maintain good connection between tracks with low resistive losses.

Figure 4:
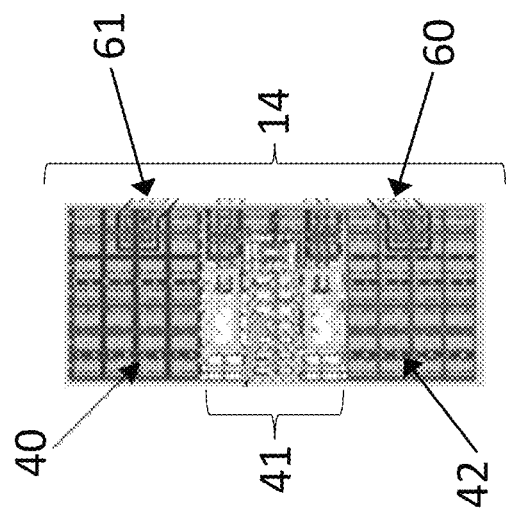
FIG. 4 illustrates detail of a notch filter of FIG. 3.
Figure 4:
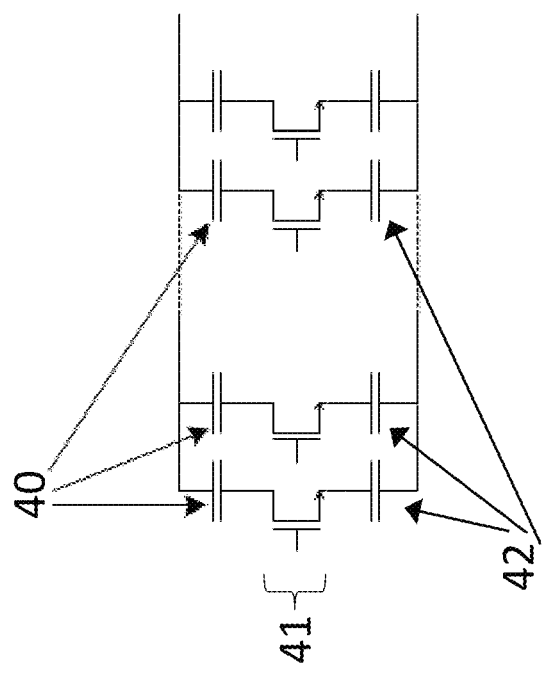

FIG. 4 illustrates more detail of one of the notch filters (14) wherein the filter comprises binary weighted capacitors 40, 42 (but can be of any weight) and tuning switches 41 which may be MOSFETS. By switching in various capacitors, the overall capacitance of each of the primary and secondary notch filters 14, 24 can be independently trimmed as desired. The filters maybe tuned to the same notch frequency on each of the primary and secondary sides to enhance coupling as previously described. A double notch (attenuation of unwanted signals at two frequencies) can be obtained by tuning each notch filter to a different unwanted frequency.

Figure 5:
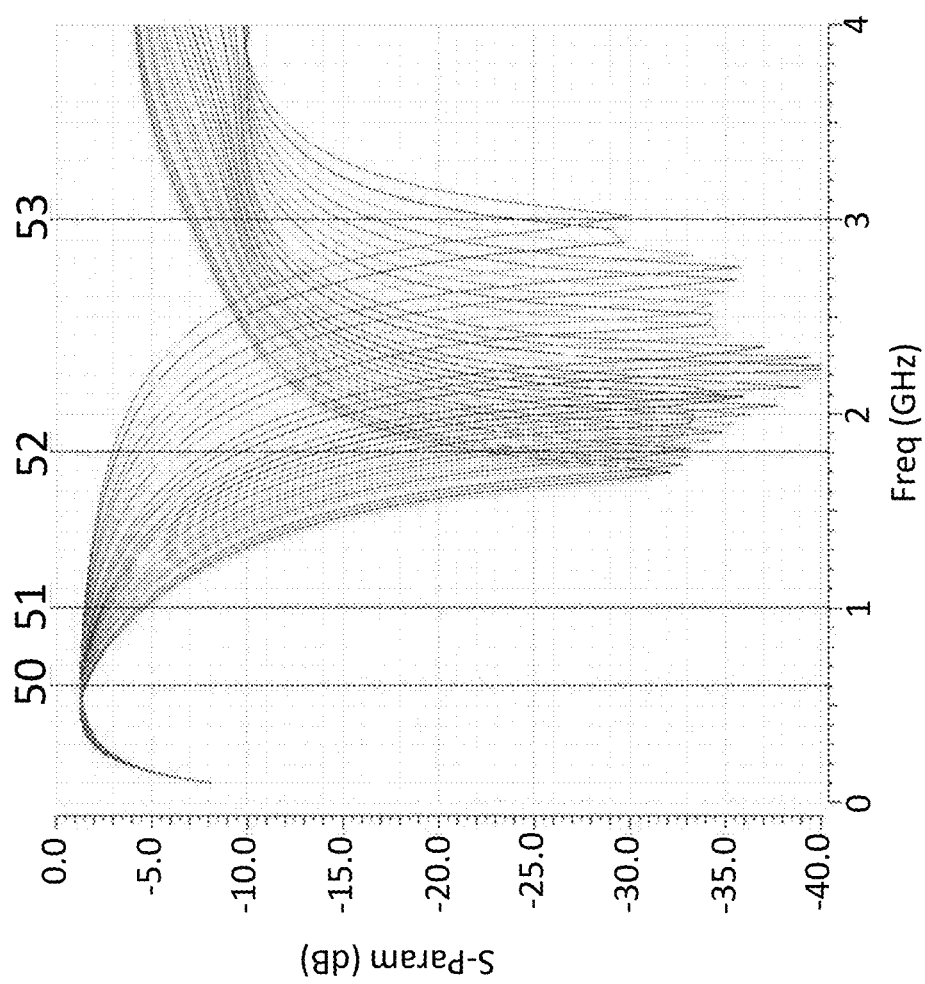
FIG. 5 illustrates insertion loss of the disclosed balun with various tuning states of the integrated notch filter.

FIG. 5 shows the insertion loss of the implemented structure for different notch filter tuning values when identical notch filters are positioned on the primary and the secondary dies of the balun. The balun is simulated using finite-element method (FEM) by Momentum software from Keysight, as well as true capacitor models including parasitic losses and tuning switches. The wanted frequency range spans from 600 MHz to 1 GHz (50 to 51), and the unwanted blocker frequency at 3×LO spans from 1.8 to 3 GHz (52 to 53). For any frequency within the required band a setting is available for the notch capacitor to enable high attenuation of the corresponding unwanted signal(s).

Disclosed herein is a low-loss balun and integrated filter which provides an excellent combination of balanced signals at the wanted frequency and attenuation at blocker frequencies, resulting in better immunity to unwanted blocker signals. The main purpose is to attenuate 3rd order harmonics, but the tunable notch filters are applicable to any unwanted signals and not just to harmonics. The notch filters are positioned in an on-chip balun, typically before the LNA (as the i/p of the LNA) as shown in FIG. 1B, but the balun is not limited to this position.

All internal windings of the balun contribute to the magnetic coupling between primary and secondary sides. Therefore, all windings contribute to the balun functionality at the wanted frequency, and all windings also contribute to the filter functionality at the blocker frequency. A symmetrical layout provides maximum coupling between primary and secondary sides and results in an efficient and balanced balun with a balanced output signal.

In a PCB mounted balun, Q value is usually about 40 or 50. The Q value of an on-chip balun is usually low, but as the claimed balun is combined with an integrated notch filter, the resonance between primary and secondary can be utilised so that the resulting on-chip balun is more efficient and has a Q value that is comparable to a balun comprising external PCB mounted components.

In summary, both balun and notch functionality are integrated into one single component. The resulting balun is hence a combination of:
 1. Balun
 2. Notch filter
 3. Current source
which provide the following advantages:
 1. Minimized on-chip area increase
 2. Improved Q-value for the notch filter 3. Simplified notch filter tuning, since the two capacitors can use the same tuning value.

This disclosure provides a balun by way of a different approach to known systems, which have either notch-filter functionality with the help of a balun, or a different balun/notch-filter combination which is less effective.

The invention claimed is:

1. An on-chip balun comprising:
   a primary side;
   a secondary side; and
   a notch filter, wherein the notch filter comprises a capacitance in parallel with a portion of the primary side and a capacitance in parallel with a portion of the secondary side.

2. The on-chip balun of claim 1 wherein the capacitances are arranged to be independently tunable.

3. The on-chip balun of claim 1 wherein the notch filter is tunable and wherein the notch filter comprises switches arranged to add or subtract capacitance from the notch filter.

4. The on-chip balun of claim 3 wherein the switches are arranged so that the capacitance of the notch filter may be added to or subtracted from on the fly.

5. The on-chip balun of claim 1 wherein the layout of the balun is symmetrical between primary side and secondary side.

6. The on-chip balun of claim 1 wherein the primary and secondary side comprise inductors formed by concentric tracks of the balun.

7. The on-chip balun of claim 1 wherein the primary and secondary sides are formed of a single layer of metal.

8. The on-chip balun of claim 1 wherein the primary and secondary sides are formed of a plurality of layers of metal.

9. The on-chip balun of claim 8 wherein the primary side is formed on one layer of metal of the chip and the secondary side is formed on another layer of metal of the chip.

10. A receive chain comprising a balun of claim 1.

11. An on-chip transformer comprising:
    a primary side;
    a secondary side; and
    a notch filter, wherein the notch filter comprises a capacitance in parallel with a portion of the primary side and a capacitance in parallel with a portion of the secondary side.

12. The on-chip transformer of claim 11 wherein the capacitances are arranged to be independently tunable.

13. The on-chip transformer of claim 11 wherein the notch filter is tunable and wherein the notch filter comprises switches arranged to add or subtract capacitance from the notch filter.

14. The on-chip transformer of claim 13 wherein the switches are arranged so that the capacitance of the notch filter may be added to or subtracted from on the fly.

15. The on-chip transformer of claim 11 wherein the layout of the transformer is symmetrical between primary side and secondary side.

16. The on-chip transformer of claim 11 wherein the primary and secondary side comprise inductors formed by concentric tracks of the transformer.

17. The on-chip transformer of claim 11 wherein the primary and secondary sides are formed of a single layer of metal.

18. The on-chip transformer of claim 11 wherein the primary and secondary sides are formed of a plurality of layers of metal.

19. The on-chip transformer of claim 18 wherein the primary side is formed on one layer of metal of the chip and the secondary side is formed on another layer of metal of the chip.

* * * * *